United States Patent
Malm

(10) Patent No.: US 8,587,083 B2
(45) Date of Patent: Nov. 19, 2013

(54) MICROBOLOMETER SEMICONDUCTOR MATERIAL

(76) Inventor: Gunnar Malm, Bro (SE)

( * ) Notice: Subject to any disclaimer, the term of this patent is extended or adjusted under 35 U.S.C. 154(b) by 17 days.

(21) Appl. No.: 13/378,853

(22) PCT Filed: Jun. 17, 2010

(86) PCT No.: PCT/SE2010/000168
§ 371 (c)(1),
(2), (4) Date: Feb. 9, 2012

(87) PCT Pub. No.: WO2010/147532
PCT Pub. Date: Dec. 23, 2010

(65) Prior Publication Data
US 2012/0139078 A1 Jun. 7, 2012

(30) Foreign Application Priority Data
Jun. 17, 2009 (SE) .................................. 0900824

(51) Int. Cl.
*H01L 31/058* (2006.01)
*H01L 27/14* (2006.01)
*G01J 5/20* (2006.01)
*G01J 5/00* (2006.01)
*G01T 1/24* (2006.01)

(52) U.S. Cl.
USPC ... 257/467; 257/414; 250/338.4; 250/370.09; 250/370.08; 250/338.1

(58) Field of Classification Search
None
See application file for complete search history.

(56) References Cited

U.S. PATENT DOCUMENTS

| 2004/0097021 A1 | 5/2004 | Augusto et al. | |
|---|---|---|---|
| 2008/0067499 A1* | 3/2008 | Maa et al. | 257/15 |
| 2009/0140148 A1* | 6/2009 | Yang et al. | 250/338.4 |

FOREIGN PATENT DOCUMENTS

| WO | 01/54189 A1 | 7/2001 |
|---|---|---|
| WO | 02/08707 A1 | 1/2002 |
| WO | WO 0208707 A1 * | 1/2002 |
| WO | 2007/089204 A1 | 8/2007 |

OTHER PUBLICATIONS

International Search Report in corresponding International Application No. PCT/SE2010/000168 mailed on Sep. 23, 2010.
Written Opinion of the International Searching Authority in corresponding International Application No. PCT/SE2010/000168 mailed on Sep. 23, 2010.

(Continued)

*Primary Examiner* — Julio J Maldonado
*Assistant Examiner* — Harpreet Singh
(74) *Attorney, Agent, or Firm* — Potomac Patent Group, PLLC

(57) ABSTRACT

A sensor for detecting intensity of radiation such as of infrared radiation includes an ROIC substrate (9) and a resistance element (1) arranged at a distance of the surface of the ROIC substrate. The resistance element comprises one more semiconducting layers such as a silicon semiconducting layer and a semiconducting layer of a silicon-germanium alloy forming a heterojunction. The semiconducting layer or layers can be doped with one or more impurity dopants, the doping level or levels selected so that the layer retains the basic crystallographic properties of the respective material such as those of monosilicon or a monocrystalline silicon-germanium alloy. The impurity dopants are selected from the elements in groups IE, IV, and V, in particular among boron, aluminium, indium, arsenic, phosphorous, antimony, germanium, carbon and tin. The doping can be abrupt so that there is an interior layer inside said semiconducting layer or layers having a significantly higher doping level.

11 Claims, 4 Drawing Sheets

(56) References Cited

OTHER PUBLICATIONS

C. Vieider et al.; "Low-cost far infrared bolometer camera for automotive use"; Proc. SPIE vol. 6542, 65421L; Infrared Technology and Applications XXXIII; May 14, 2007; pp. 1-10.

S.G.E. Wissmar; "SiGe quantum well thermistor materials"; Thin Solid Films; vol. 517, Issue 1; pp. 337-339; Fifth International Conference on Silicon Epitaxy and Heterostructures (ICSI-5); Nov. 3, 2008.

Paul W. Kruse, et al.; "Uncooled Thermal Imaging Arrays, Systems and Applications"; SPIE Press, 2001; pp. 1-119; Academic Press, Chestnut Hill, MA.

L. Dong, et al.; "A High Performance Single-Chip Uncooled A-SI TFT Infrared Sensor"; Institute of Microelectronics, Tsinghua University; Transducers '03; The 12th International Conference on Solid State Sensors, Actuators and Microsystems; 2D2.3; IEEE; Jun. 8-12, 2003; vol. 1; pp. 312-315; Boston, MA.

Hideyuki Funaki, et al.; "A 160×120 pixel uncooled TEC-less infrared radiation focal plane array on a standard ceramic package"; Proc. of SPIE; vol. 7298, 72980W-1; 2009; pp. 1-9.

Frank Niklaus, et al.; "MEMS-Based Uncooled Infrared Bolometer Arrays—A Review"; Proc. of SPIE vol. 6836 68360D; 2007; pp. 1-15; Beijing, China.

* cited by examiner

Monocrystalline silicon 2  Contact (e.g. metal) 4
Silicon-germanium alloy 3

Top and bottom electrode contacts

Multiplexing circuitry
AD conversion circuitry
Amplification circuitry

MoSi | Semiconductor layers | Al
SiN | SiO₂/SiN | Au
 | | Ti

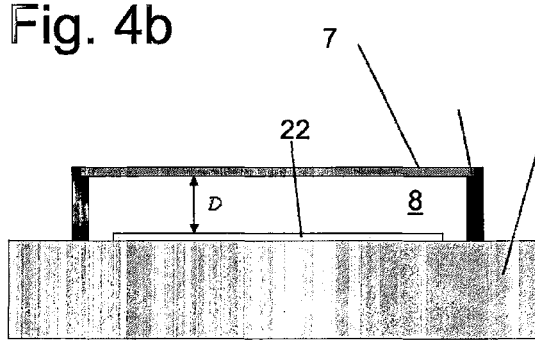
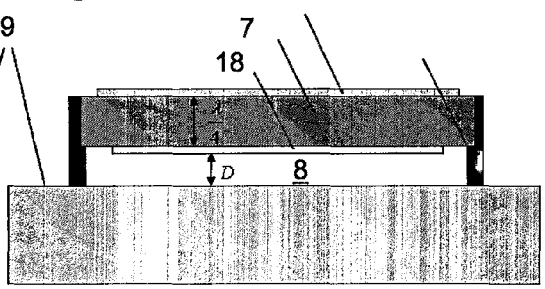
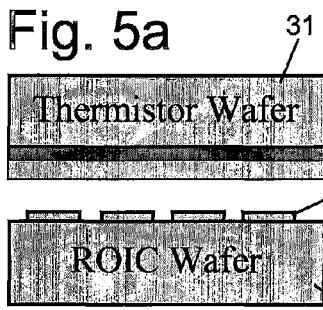
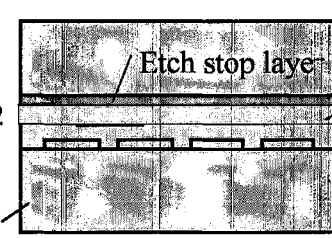
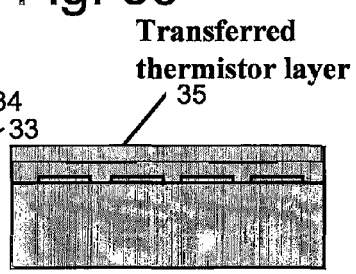
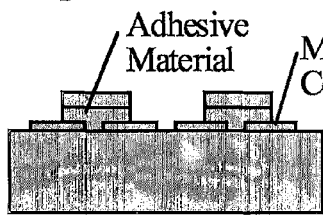
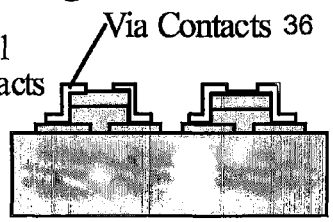
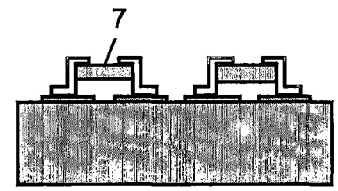

MICROBOLOMETER SEMICONDUCTOR MATERIAL

RELATED APPLICATION

This application claims priority and benefit from Swedish patent application No. 0900824-4, filed Jun. 17, 2009, the entire teachings of which are incorporated herein by reference.

TECHNICAL FIELD

The present invention relates to an infrared bolometer sensor material.

BACKGROUND

A bolometer comprises as a main element a component that changes its electrical resistivity or resistance when exposed to different temperatures, this component also called herein a resistance element. The component is mounted so that it absorbs radiation, e.g. visible light or infrared light, the intensity of which is to be detected. The component is connected to or in an electric circuit, sensing the resistance changes, the electric circuit called a read-out electronic circuit.

The performance of infrared bolometers and infrared bolometer arrays for imaging applications can be significantly increased if said component comprises sensing devices based on semiconductor grade materials, typically high purity mono-crystalline materials and structures, which are used on top of read-out electronic circuits and have a high sensitivity and a low noise. The read-out electronic circuits provide a corresponding signal from which also small changes of resistance and thereby of the radiation intensity can be derived.

A large number of infrared imaging applications, such as thermography, fire fighting, automotive night vision and surveillance require infrared imaging arrays having a high performance and preferably also having a low cost. For many of these applications and systems, noise equivalent temperature differences (NETDs) in the order of 20 mK are required. The NETD is a performance parameter of an infrared imaging system and is defined as the temperature difference between two side-by-side blackbodies of large lateral extent that gives rise to a difference in signal-to-noise-ratio of 1 in the electrical outputs of the two halves of the infrared sensor array when the emitted infrared radiation from the two blackbodies illuminate the infrared sensor array. To provide infrared bolometer arrays having such high performance parameters for the mentioned applications, it is also desirable that they can be operated at ambient temperatures, such bolometers called uncooled infrared bolometers, and in an atmospheric pressure environment or at least in an environment having low requirements on an ambient vacuum atmosphere, i.e. that they can be operated at not too small pressures. Thereby, the cost for the vacuum packaging of an infrared bolometer array can be reduced. Hence, a technology is needed to manufacture and integrate infrared detectors that have a high sensitivity and good noise characteristics.

Said main component can, in the case where is comprises a semiconductor material, include one or more PN junctions, such as in one or more diodes or in one or more transistors. In particular the PN junctions can be formed from amorphous materials such as amorphous silicon on top of CMOS based read-out integrated circuit wafers, the read-out circuit components being placed at least partly underneath the bolometer, see P. W. Kruse, "Uncooled Thermal Imaging. Arrays, Systems, and Applications", SPIE Press, Bellingham, U.S.A, 2001. and L. Dong, R. F. Yue, L. T. Liu, "A high performance single-chip uncooled a-Si TFT infrared sensor", Proc. Transducers 2003, Vol. 1, pp. 312-315. Amorphous materials are used since they can be deposited on the CMOS wafers without destroying the IC circuits. However, a component comprising such PN junctions suffer from a low sensitivity and high noise characteristics.

Semiconductor structures comprising horizontally placed diodes or PN junctions, i.e. basically semiconductor chips having the PN junctions located parallel to the large surfaces of the chips, such as semiconductor junction devices made from monocrystalline silicon or devices comprising monocrystalline quantum well (QW) structures, which are made on silicon-on-insulator (SOI) wafers, have a high temperature sensitivity and low noise characteristics, i.e. the electrical resistance thereof changes considerably for small temperature changes and a corresponding generated signal representing the resistance has a considerable swing and low noise, see H. Funaki, H. Honda, I. Fujiwara, H. Yagi, K. Ishii, K. Sasaki, "A 160×120 pixel uncooled TEC-less infrared radiation focal plane array on a standard ceramic package", Proc SPIE 2009, Vol. 7298, 72980W. However, the read-out electronic circuits of bolometers comprising such semiconductor structures have a very limited functionality since they must be placed beside the resistance component due to the fact that standard CMOS circuitry cannot be manufactured underneath the resistance component. Generally, monocrystalline and/or epitaxially deposited materials requiring high deposition temperatures cannot be deposited on top of integrated circuits without destroying the same.

The performance of uncooled infrared bolometers is discussed in the paper F. Niklaus, C. Vieider, H. Jakobsen, "MEMS-Based Uncooled Infrared Bolometer Arrays—A Review", Proc. SPIE 2007, Vol. 6836, pp. 0D1-0D15, Beijing, China, which is incorporated by reference herein.

Uncooled infrared bolometers and a method of manufacturing them are disclosed in the published International patent application WO 01/54189, which is incorporated by reference herein. They comprise a membrane structure that includes the resistance element and is arranged at a distance of a substrate carrying the read-out electronic circuits. The resistance element comprises mono-Si, poly-Si or quantum wells based on GaAs as the sensor material and it is geometrically arranged in different ways.

SUMMARY OF THE INVENTION

It is an object of the invention to provide an efficient bolometer.

Generally, a bolometer comprises a main component, the resistance element or thermistor, that includes one or more epitaxially grown single-crystalline semiconductor layers for sensing temperature, placed on top or at the side of integrated electronic circuitry for signal read-out.

In a first embodiment a bolometer includes one or several epitaxially grown single-crystalline semiconductor layers that are placed in series, such as on top of each other. The bolometer can be particularly suited for detecting the intensity of infrared light and can be one of a plurality of element bolometers placed in an array. The layers are formed using silicon and one or several impurity dopants. The layers are to be considered as alloys of silicon and one or several impurity atom species, while retaining the basic crystallographic properties of silicon. The impurity dopants are selected from the elements in groups III, IV, and V, and in particular among the following: boron, aluminium, indium, arsenic, phosphorous, antimony, germanium, carbon and tin.

The detailed function of the structure is such that the intrinsic thermal coefficient of resistance (TCR) of a single crystalline material is enhanced by the addition of a potential barrier experienced by the electronic carriers, in the electronic band structure of a crystalline semiconductor material. The barrier effectively reduces the carrier concentration in part of the layered structure, well beyond what is known as the background doping level in the art. In this manner a thermal response in the resistivity, different from and higher than, even significantly higher than, that of a uniformly doped semiconductor material, under the same applied bias conditions, can be obtained.

The potential barrier is modulated by an external applied bias voltage to allow a current flow in the bolometer that is suitable for proper operation of the attached read-out circuit.

The structure can be unipolar, so that a significant part of the potential barrier is introduced in either the valence band, populated by holes, or in the conduction band, populated by electrons. In the art, such a structure is obtained by using dopants of a single polarity—acceptors or donors or by inverting any layer containing an opposite polarity of doping. A contact metal with a high work-function difference for the undesired carrier type, e.g. platinum on silicon to obtain a high electron barrier and predominantly hole conduction, might also be employed, known as a Schottky-barrier in the art.

A bolometer as described herein may have an improved sensitivity and lower noise, compared to prior art bolometer structures based on semiconductor materials, thereby overcoming or at least reducing at least one of the above mentioned problems.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularity in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIGS. 4a, 4b are cross-sectional views of two bolometer designs comprising resonant optical cavities for high absorption of the incident infrared radiation, FIGS. 5a-5f are schematics illustrating basic steps of manufacturing an uncooled infrared bolometer array comprising separate fabrication of ROIC wafer and handle wafer with bolometer thermistor material, adhesive wafer bonding, thinning of handle wafer, definition of resistance elements, via formation and sacrificial etching of adhesive, respectively.

DETAILED DESCRIPTION

Figures 1A, 1B:
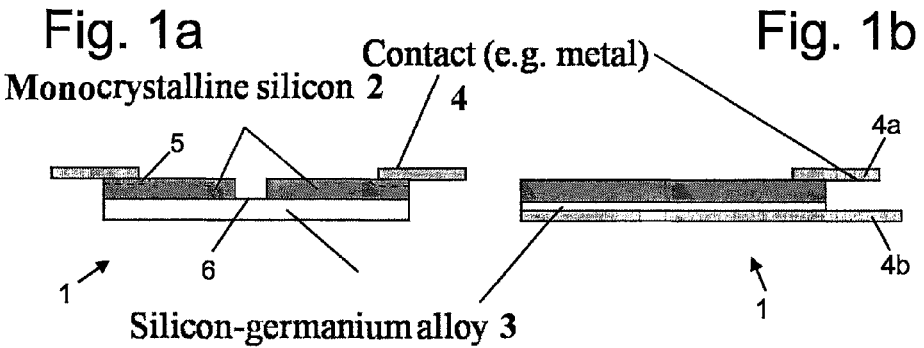
FIGS. 1a and 1b are schematic sectional views of resistance elements comprising semiconductor layers for a bolometer.

In a first embodiment, a bolometer based on semiconductor materials comprises as a resistance element 1 two layers, see FIGS. 1a and 1b, one silicon layer 2 and one silicon-germanium alloy layer 3, the layer having thermodynamically stable or at least meta-stable thicknesses and also the germanium concentration being thermodynamically stable Typical thicknesses are in the range of 10-100 nm and the atomic concentration of Ge is typically less than 40% and can even be less than e.g. 30%. The silicon-germanium layer 3 can be strained or unstrained. The silicon-germanium layer 3 is not intended to provide any quantum mechanical carrier confinement, known in the art as a quantum well (QW) or any alteration of the electronic band structure, other than strain-induced effects on e.g. the mobility and a band gap change, as generally expected for a given germanium concentration.

The concentration of the components of the silicon-germanium alloy in layer 3 can be constant in the layer or graded, in the thickness direction of the layer, from a given value such as 40% to e.g. zero over a distance that can be relatively small compared to the total thickness of the layer, e.g. a distance of a few nm, say 5-50 nm, but generally over a range that is smaller than or equal to the thickness of the layer. The direction of the grading can be arbitrary relative to the growth direction. In the art, this type of structure is known as a single heterojunction device. Metal contact layers 4 having a low contact resistivity can be formed on the top and bottom of these two layers 2, 3, or generally they can be applied in such a way so that the low resistivity layers, which are part of the structure, can be easily accessed. For example, it may be desirable to place both contacts on top of the structure as in FIG. 1a. Surface regions 5 having high dopant concentrations can be embedded in the two-layer structure, in order to ensure a low contact resistance for a normal choice of contact metals, or be applied as areas of a special layer, as known in the art.

The resistance element can comprise more than two layers such as a silicon-germanium layer arranged between two silicon layers.

The structure of FIG. 1a comprises two areas 2 of monocrystalline silicon located on top of a larger area 3 of the silicon-germanium alloy. The two areas 2 of monocrystalline silicon are thus separated from each other, and electrical contacts areas 4 such as contact pads or contact leads are placed on top of the monocrystalline silicon areas, one contact area on each monocrystalline silicon area. As seen in the figure, the two monocrystalline silicon areas 2 are separated by a free area 6 on the upper surface of the silicon-germanium alloy layer 3 and the contact areas 4 are located at the edges of the two monocrystalline silicon areas which are distant from the free area.

The structure of FIG. 1b comprises a single area 2 of monocrystalline silicon located on top of the layer 2 of silicon-germanium alloy. One electrical contact area 4a is located on top of the monocrystalline silicon, for instance at an edge thereof, and another contact area 4b is placed at the bottom of the silicon-germanium alloy layer, e.g. extending over the whole bottom surface thereof as seen in the figure.

The variations of the electrical resistance for electrical current flowing between the two layers 2, 3 is detected by sensing e.g. the intensity of the electrical current flowing between the contact areas 4 and is used to measure temperature changes due to absorbed infrared radiation absorbed in the layers. The electronic integrated circuitry (ROIC) for the bolometer signal read-out and processing can be at least partly placed underneath the resistance element 1, see FIGS. 3, 4a and 4b.

A resistance element such as the structure of FIG. 1a or 1b can constitute or be comprised in a free-hanging or freely suspended membrane structure 7, see FIG. 3, as will be described in more detail below. It is in a suitable way electrically connected to the underlying electronic circuits and is by the cavity or free space 8 thermally isolated from an underlying substrate 9 containing the read-out circuits 10, the cavity or free space thus located between the resistance element 1 and the substrate.

In a resistance element 1 comprising the semiconductor layers mentioned above carbon can be introduced. Typical concentrations are in the range of 0-1% (atomic), e.g. within the range of 0.1-0.5% (atomic), which is readily achieved by state of the art CVD equipment using methyl-silane as a pre-cursor gas. A higher concentration would lead to possible inclusion of beta silicon-carbide which is an undesired crystal structure having a negative influence on noise properties and resistance. Carbon is also used to stabilize the impurity dopant profile and to balance the strain in the silicon-germanium alloy for the case where thicker layers are desired. This is thanks to the small atomic size of carbon which relieves the strain introduced by the large germanium atoms.

Figure 6A:
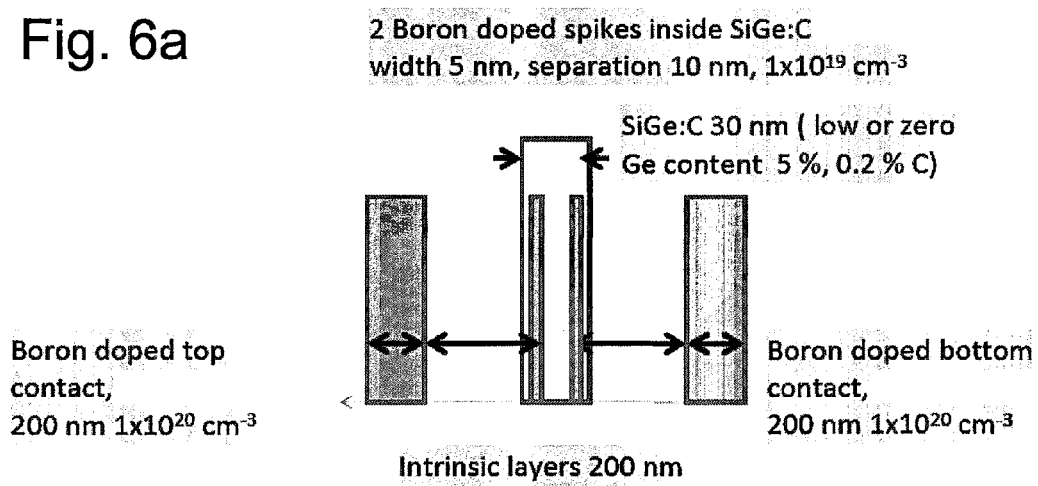
FIG. 6a is a schematic of a resistance element structure comprising two interior, highly doped, relatively thin sublayers inside a monocrystalline semiconductor layer such as a SiGe-layer.
Figure 6B:
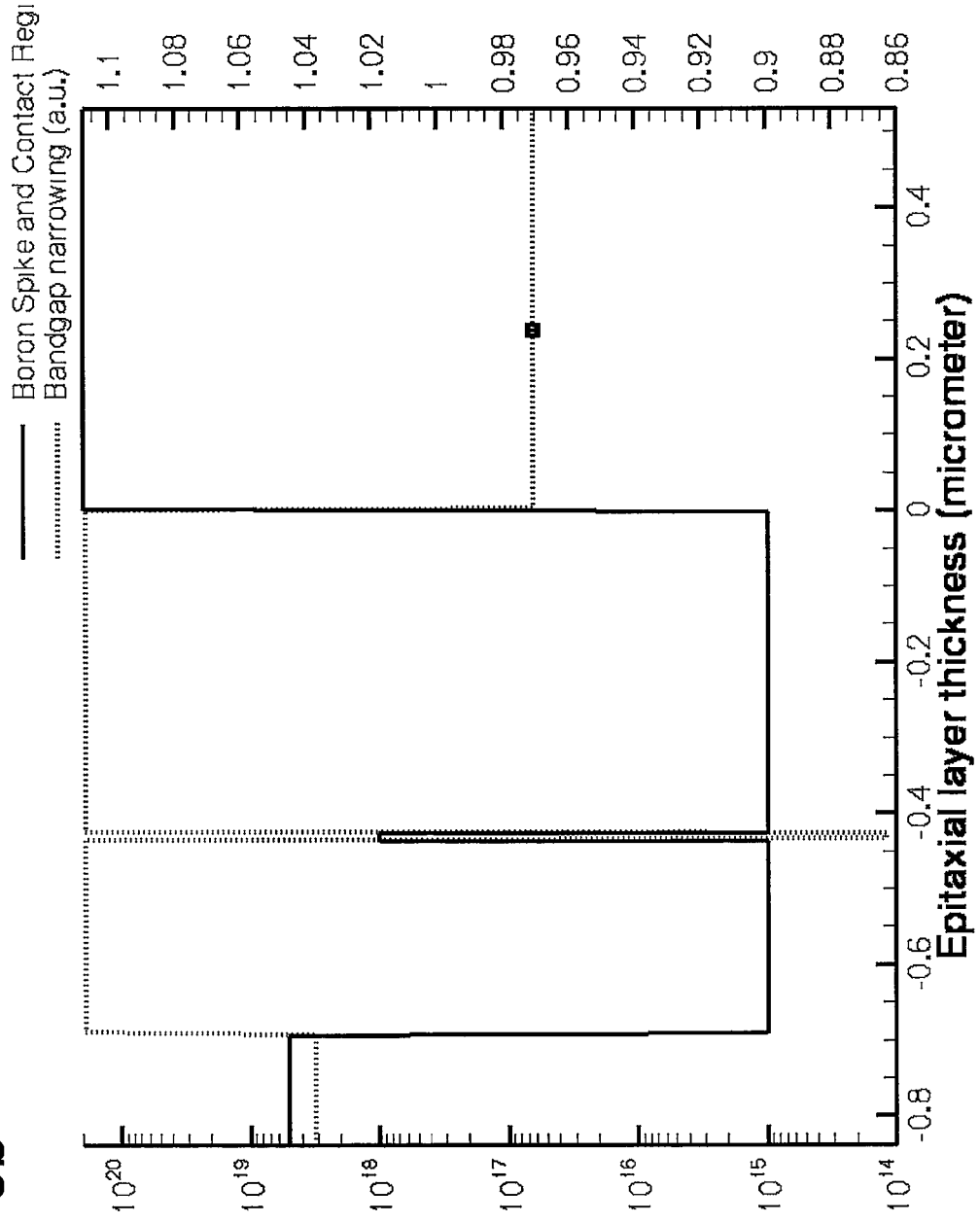
FIG. 6b is a diagram of the doping level of boron and the resulting band gap narrowing in a resistance element structure including a monocrystalline semiconductor layer produced by epitaxial growth.

A resistance element comprising semiconductor layers as mentioned above may include one or more silicon or silicon germanium layers having abrupt doping gradients, see FIG. 6a, in which two 'boron doped spikes' having thicknesses of 5 nm inside a central carbon doped SiGe layer, the central layer located between intrinsic, i.e. non-doped, Si-layers, are illustrated. One or more layers could be utilized to tailor the resistance of the complete layer stack or only the silicon layer 2. The silicon germanium layer 3 could be omitted as will also be described below. The doping gradient provides the above mentioned potential barrier by invoking a change in the band structure known as bandgap narrowing in the art. In one example a layer such as a silicon semiconducting layer and/or a silicon-germanium alloy layer has a thickness of about 10 to a few 100 nm layer, say up to 1000 nm, and an atomically abrupt dopant profile with a transition of several orders of magnitude in concentration over a few nm, for example from $1 \cdot 10^{15}$ cm$^{-3}$ to $1 \cdot 10^{19}$ cm$^{-3}$ over a relatively small distance such as 10 nm or within the range of 2-20 nm, see the diagram of FIG. 6b illustrating also the resulting bandgap narrowing.

Thus generally, the silicon semiconducting layer 2 and/or the silicon-germanium alloy layer 3 can comprise at least one interior layer region having a doping level that is significantly higher than that of the rest of the layer, compare FIG. 6a. The interior layer region may typically have a thickness in the range of 5-50 nm and more generally within the range of 5-1000 nm. The interior region can have a doping level in the range of a $1 \cdot 10^3$-$1 \cdot 10^5$ times the doping level in the rest of the layer. The doping level may also be higher than the limit for bandgap narrowing, typically $1 \cdot 10^{17}$ cm$^{-3}$ to $1 \cdot 10^{20}$ cm$^{-3}$.

A resistance element comprising semiconductor layers as mentioned above can, as used in a bolometer, be made to have a bias dependent TCR (Temperature Coefficient of Resistance) value due to the presence of the potential barrier. The application of a bias voltage to the terminals effectively redistributes the electronic carriers in the device, due the band bending or electric field. In a semiconductor these two descriptions are equivalent. Due thereto the total electrical conductance and hence the resistance of layer 2 as well as its TCR can be changed. The main advantage is that the TCR can be adjusted after final processing, meeting the needs of the ROIC in a better way. The grading of the concentration of the components of the silicon-germanium alloy layer where the grading is in the thickness direction of the layer can give such a structure having a bias dependent TCR. Another example of a structure having a bias dependent TCR is a silicon-germanium layer embedded in between two silicon layers having significantly different thicknesses, such as thicknesses differing from one another with more than 10%.

In a resistance element comprising the semiconductor layers mentioned above the contact configuration can be reversed, so that the polarity of the applied voltage is reversed. Thereby, the potential bather can effectively removed and the material retains a bulk-like semiconductor TCR. This type of element may serve as a useful 'on-chip' reference.

In a bolometer including resistance elements comprising semiconductor layers as mentioned above a device having noise cancellation can be obtained by using a pair of resistance elements having electrically tuned and different TCR values, fabricated using the same layer structure but with reversed contact configurations. E.g. the structure of FIG. 2a can be used where the voltage polarity applied across the terminals is different for the two structures in the pair. In one embodiment the pair of resistance elements have TCRs of opposite signs, positive and negative. The noise cancellation can be achieved using a comparator device, not shown, implemented in the read-out circuit.

Figure 7:
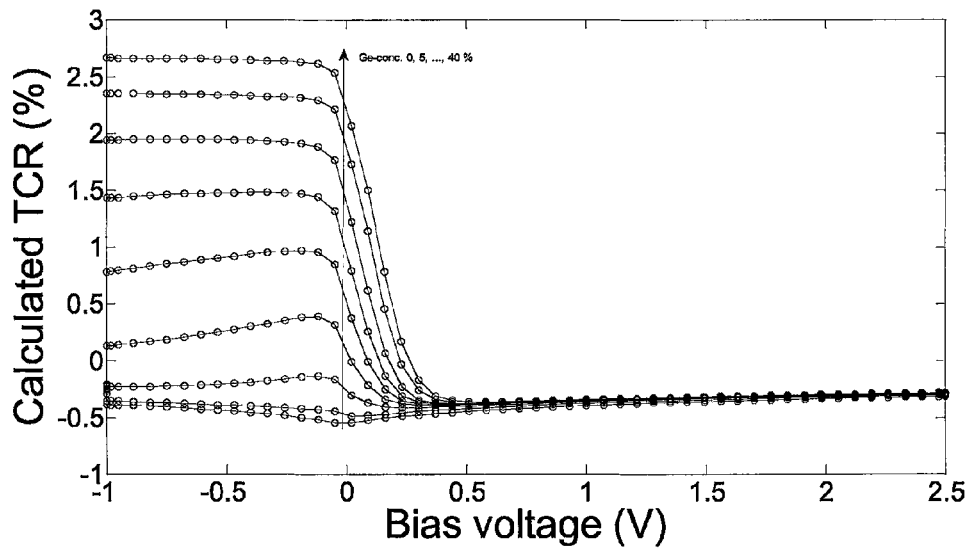
FIG. 7 is a diagram of the calculated TCR for various bias voltage applied to a resistance element including a silicon semiconductor for different concentrations of Ge.

A resistance element comprising semiconductor layers as mentioned above can be given a TCR having a zero value, at least at a specified temperature, by choosing a suitable barrier and bias point. As seen in the diagram of FIG. 7 a value of TCR equal to zero can be obtained for a wide range of Ge-concentrations, the exact location along the x-axis being determined by the Ge-concentration. The mechanism is explained as follows. The left hand side of the figure represents the effect of a potential barrier to raise the TCR whereas the right hand side shows the action of a bulk material having no barrier. The reason for this is the difference in current transport direction for positive and negative applied bias voltages.

Figures 2A, 2B, 2C:
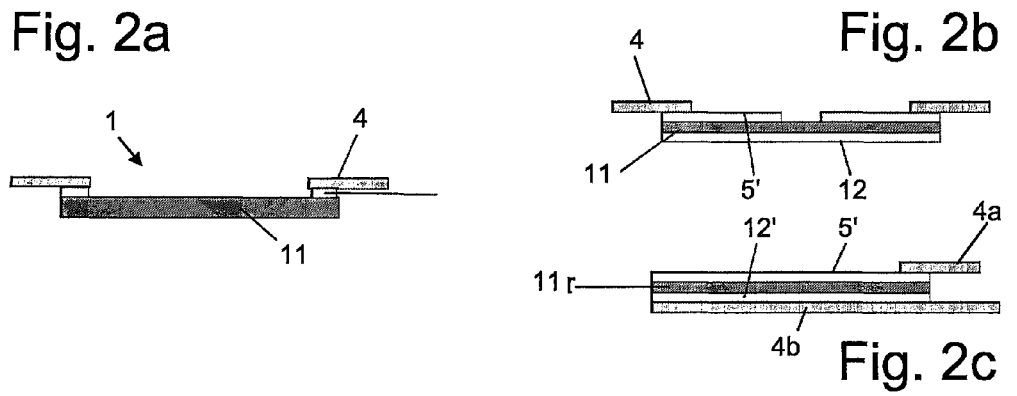
FIGS. 2a, 2b and 2c are schematic sectional views of an alternative embodiment of resistance elements comprising semiconductor layers for a bolometer.

In a second embodiment, the resistor element 1 of a bolometer can comprise a single layer 11 of mono-crystalline silicon or of a silicon-germanium alloy as a temperature sensitive thermistor material, see FIGS. 2a, 2b and 2c. The silicon-germanium alloy can have the same composition as described above, i.e. containing less than 30 atomic % of Ge. The single layer 11 can be doped with one or more impurity dopants, the doping levels selected so that the layer retains the basic crystallographic properties of silicon, i.e. so that is not transformed to a poly-crystalline or amorphous state. The impurity dopants can be selected from the elements in groups III, N and V of the periodic table and in particular among boron, aluminium, indium, arsenic, phosphorous, antimony, germanium, carbon and tin. Typical doping levels are in the range from $1 \cdot 10^{14}$ cm$^{-3}$ until the level of solid solubility $1 \cdot 10^{20}$ cm$^{-3}$. The thermistor material may contain highly doped, e.g. p++, layers as electrical contact layers on the top of or on the top and the bottom of the thermistor layer as shown in FIGS. 2a, 2b and 2c. The current path for the measurement current may be horizontally through the thermistor, as in FIG. 2a, or vertically through the thermistor layer, as in FIGS. 2b and 2c.

In the structure of FIG. 2a the single layer 11 is designed as an area having electrical contact areas 4 on top thereof, e.g. at opposite edges of the single layer area. The electrical connection between the contact areas and the single layer is improved by a connection layer 5' having a relatively low electrical resistivity and made from e.g. highly doped monosilicon or a highly doped silicon-germanium alloy, respectively. The regions of the connection layer are only applied directly beneath the contact areas 4, this allowing a substantial portion of the single layer 11 to be free from adjacent, highly conducting layers and this in turn allowing a substantially horizontal flow of electrical current through the single layer when the device is used for detection purposes.

In the structure of FIG. 2b the two separated regions of the connection layer 5' cover a substantial portion of the surface of the single layer 11, e.g. more than 80 or 90% thereof. Also, a bottom layer 12 is located at the bottom of the single layer that has a relatively low electrical resistivity and e.g. made from the same material as the connection layer 5', i.e. highly doped monosilicon or a highly doped silicon-germanium alloy. Thus, the electrical current will mainly flow between each of the regions of the top connection layer 5' and the bottom, low resistivity layer 12 through the single layer 11 and over a relatively short horizontal path mainly through the bottom layer only at the place where the regions of the connection layer 5 do not cover the single layer, this allowing a substantially vertical flow of electrical current through the single layer when the device is in use. d are separated from each other, and electrical contacts areas 4 such as contact pads or contact leads are placed on top of the monocrystalline silicon areas, one contact area on each monocrystalline silicon area.

In the structure of FIG. 2c the direction of electrical current flowing through the single layer 11 is also substantially vertical, i.e. transversely, in a direction perpendicular to the large surface of the single layer. The single layer 11 is over both its two opposite large surfaces covered with connection layers, a top layer 5' and a bottom layer 12', having a relatively low electrical resistivity and made from e.g. highly doped monosilicon or a highly doped silicon-germanium alloy as described above. There is, as in FIG. 1b, a single top contact area 4a that can be located at an edge of the single layer 11 and the bottom surface of the single layer there is a bottom contact area 4, covering the entire bottom surface of the lower connection layer 12'.

Figure 3:
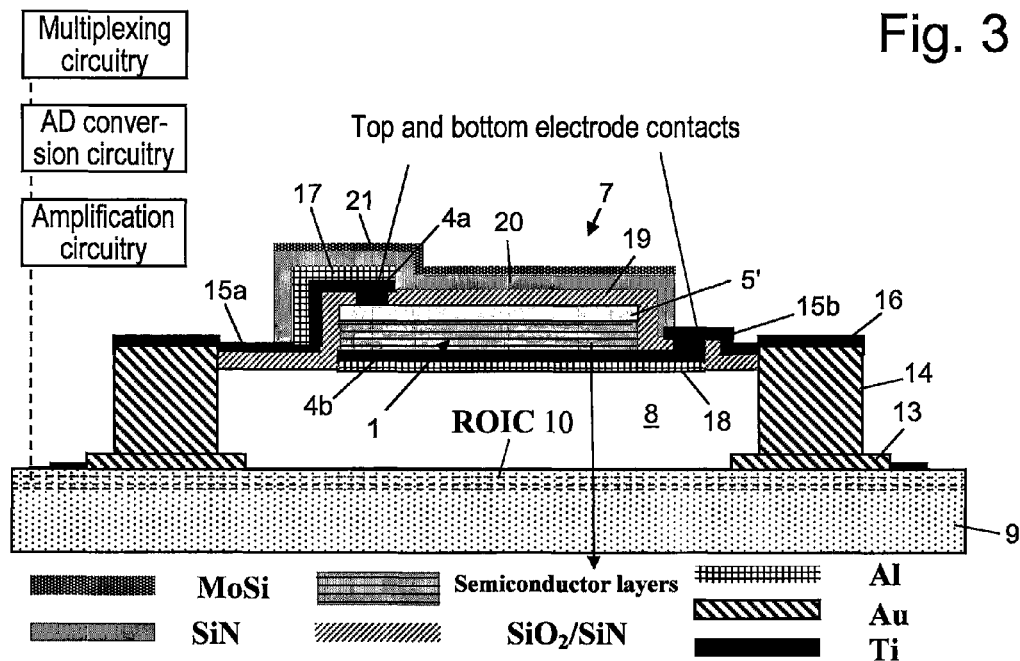
FIG. 3 is a schematic sectional view of a bolometer comprising a freely suspended membrane holding a resistance element comprising semiconductor layers.

Also, the resistance element 1 of FIG. 2a, 2b or 2c can be used in a freely suspended configuration, see FIGS. 3, 4a and 4b, electrically connected to underlying electronic circuits 10 and thermally isolated by the cavity 8 from the underlying substrate 9.

The semiconductor layer or layers in a resistance element as described above can have been manufactured by epitaxially growth on the Si device seed layer of an SOI substrate, which is then transferred and integrated above the ROIC substrate 9, e.g. a CMOS substrate, e.g. in a configuration such as that indicated in FIG. 3. For example the processing steps illustrated in FIGS. 5a-5f can be used for the transfer, integration and manufacturing of the infrared sensor array as will be described below. The bolometer described herein comprises read-out electronic circuitry (ROIC) 10 as mentioned above that can include amplification circuitry and/or AD conversion circuitry and/or multiplexing circuitry.

In the suspended configuration of FIG. 3 a base or carrying structure is provided by the substrate 9 on or in the top surface of which the patterned and otherwise modified layers forming the necessary read-out electronic circuits 10 are provided. The substrate carries on its top, outer surface contact pads 13 made from a well conducting material such as a suitable metal, e.g. gold or aluminium. Instead of pads, highly doped regions can be used. Pillars 14, also of a well conducting material, suitably the same material as in the pads 13, extend from the pads and carry at their top portion the membrane 7. The membrane comprises as its main component the resistance element 1 which as shown includes more than two semiconductor layers in this case. The resistance element also has a top connection layer 5', compare FIG. 2c, extending over its top surface. The top contact area 4a is placed at an edge of the semiconductor layers and the bottom contact area 4b extends over the bottom surface. The contact areas can be made from e.g. titanium. Electrical conductor paths 15a, 15b, suitably of the same material as the contact areas, connect the contact areas 4a, 4b to the pillars 14, such as to the top portions thereof, e.g. their top surfaces which can carry a layer 16 of the same material. The electrical resistance of the conductors path can be reduced by having layers 17, 18 made from a metal such as aluminum placed directly at the conductor paths. Electrically isolating layers 19 surround the resistance element 1 at its top and edge surface, these layers e.g. made from silicon oxide ($SiO_2$) and or silicon nitride (SiN). A layer 20 made from silicon nitride covers the resistance element structure 1 and carries at its top surface a layer 21 for enhancing the absorption of IR radiation of e.g. MoSi. The structural integrity and mechanical suspension of the membrane is mainly provided by the silicon nitride layer or layers.

The bolometer can in the conventional way contain an optical cavity structure. The mirror of such an optical cavity structure can be part of the bolometer membrane 7, see FIGS. 3 and 4a, e.g. formed by the resistance reducing layer 18, which is placed at the bottom surface of the membrane. Alternatively, the mirror can be formed by a radiation reflecting layer 22 on the top surface of substrate 9, see FIG. 4b, the optical cavity in this case formed by the cavity 8 between the thermally isolated bolometer membrane 7 and the substrate 9 for optimized absorption of infrared radiation in a desired wave-length range In the resonant optical cavity design of FIG. 4a, the resonant optical cavity is part of the bolometer membrane 7 itself. The thickness of the bolometer membrane defines the optical cavity. The membrane thickness is typically set to $\lambda/4$, where $\lambda$ is the wavelength of the targeted infrared radiation in the bolometer membrane material(s). Bolometers with resonant optical cavities as shown in FIG. 4a are emitting infrared radiation both from the upper and lower surfaces of the bolometer membranes. At the same time incoming (background) infrared radiation is absorbed only from the upper surface of the bolometer membrane while incoming (background) infrared radiation to the lower surface of the bolometer membrane is reflected by the mirror layer.

In the resonant optical cavity design of FIG. 4b the bolometer membrane 7 is placed at a distance of $\lambda/4$ from the mirror surface 22 on the substrate 9. Thus, a high fraction of the incident infrared radiation at a specific wavelength $\lambda$ is absorbed in the bolometer membrane. For a targeted wavelength interval of 8 μm to 14 μm, the distance between the bolometer membrane and the mirror on the substrate is typically about 2 μm to 2.5 μm. In such a bolometer design only the upper surface of the bolometer membrane is effectively radiating. Infrared radiation that is emitted from the lower surface of the bolometer membrane 7 is reflected by the mirror on the substrate and is again absorbed by the bolometer membrane. At the same time, incoming (background) infrared radiation is absorbed both from the upper and the lower surfaces of the bolometer membrane.

The resistance element and components and layers associated therewith can be fabricated on top of the IC wafer using a material layer transfer method. Such a material layer transfer method can e.g. include all or some of the steps described in the published International patent application WO 01/54189 cited above and/or all or some of the steps described in the published International patent application WO 2007/089204.

The bolometer can be in the conventional way be vacuum packaged using a wafer-level process, e.g. using a suitable wafer bonding technique.

A material layer transfer method for manufacturing the membrane structure 7 and in particular the resistance element 1 on top of a substrate chip holding the electronic read-out circuit can comprise the following four basic steps, see FIGS. 5*a*-5*f*.

A: Two wafers/substrates, in the following referred to as a "sacrificial wafer" or "thermistor wafer" 31, carrying the epitaxially grown semiconductor layers, e.g. in a vertical arrangement, and a "non-sacrificial wafer" or "ROIC substrate" 9, carrying CMOS structures defining the signal read-out electronic circuit, respectively, are bonded to each other by an intermediate bonding material 32, see FIGS. 5*a* and 5*b*. The non-sacrificial wafer can have metal areas 33 on its top surface for forming electrical connections and/or mirrors.

B: The sacrificial wafer 31 is thinned to a certain level, such as by grinding or etching, wet or dry, or by a combination thereof. The etching if used can be stopped at an etch-stop layer 34 consisting of e.g. $SiO_2$ or a highly doped layer of Si or SiGe, see FIG. 5*c*.

C: The transferred remaining layer 35 is patterned and electrically interconnected to the components on the non-sacrificial wafer 8 by suitable vias 36, see FIGS. 5*d* and 5*e*. Additional functional bolometer materials can be deposited.

D: The intermediate bonding material 32 which can be a polymer is stripped away, see FIG. 5*f*.

Thus, in order to manufacture for example the structures described above, in particular the structure of FIG. 3, a sacrificial wafer is produced by the steps of:

Providing a first substrate that is suitable for the final thinning process and for manufacturing the semiconductor structure of the resistance element, for example an SOI wafer comprising a relatively thick base layer of bulk monocrystalline silicon, thereupon a silicon dioxide layer and at the top a monocrystalline silicon device layer that generally is relatively thin, the Si device layer having e.g. a thickness of 100 nm.

Growing epitaxially one or more silicon and/or silicon/germanium layers on top of the seed Si device layer of the SOI wafer, defining the bolometer resistor.

Doping the grown layer or layers if required, after each growth step, or in-situ doping of the layer or layers during the respective growth steps.

Optionally applying, such as in order to achieve the structure of FIG. 3, by some deposition method, a conducting layer such as titanium and also optionally an Al layer on top of the grown layers to form electrical contacts to the grown layers.

Optionally applying, such as in order to achieve the structure of FIG. 3, by some deposition method, a passivation layer such as a SiN on top of the layers.

Optionally applying, such as in order to achieve the structure of FIG. 3, a reflecting layer such as an aluminium layer on top of the layers.

Optionally patterning the structure down to the silicon or silicon oxide layer of the SOI wafer by some etching method.

A non-sacrificial wafer or ROIC substrate 9 is produced by conventional steps of forming electronic circuits so that the substrate on its top surface has contact areas 33 for forming electrical connections and possibly metal areas for forming mirrors.

Thereupon the following steps are performed:

The two wafers are bonded to each to each other using e.g. a polymer, an oxide or other non-conductive sacrificial adhesive. The surface of the sacrificial wafer that carries the special semiconductor structure is bonded to the surface of the non-sacrificial wafer 9 that carries the contact areas 33.

The surface of the sacrificial wafer that does not carry the special semiconductor structure is now the top surface of the combined wafer structure. The bulk material of the sacrificial wafer is removed from this top surface down to the oxide layer of the SOI wafer by some suitable method.

The transferred oxide and optional Si, metal and SiN layers are patterned to provide openings for creating the via pillars.

The via pillars are created on the contact areas 33 on the ROIC substrate 9 by depositing a metal such as Au, Ni or Al.

Patterning the structure.

Applying an electrically isolating layer such as an $SiO_2$/SiN layer to provide electrical isolation around the special semiconductor structure.

Patterning the structure to provide openings down to the electrical connection layer (5') and for the structure of FIG. 3 down to the titanium layer.

Additional metal such as titanium or TiW is deposited and patterned by suitable methods to electrically contact the Si based bolometer sensor material and the via pillars.

Optionally, SiN is deposited and patterned to form supporting legs for the suspended structure.

Optionally applying an MoSi layer (21) for enhancing the absorption of IR radiation.

Optionally an anti-reflective layer, not shown, is deposited and patterned.

Optionally, the transferred and patterned layers are patterned to form parts of the bolometer structure.

The sacrificial adhesive bonding layer or layers is/are removed to form the suspended bolometer structure.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

The invention claimed is:

1. A sensor for detecting intensity of radiation, in particular of infrared radiation, including a read-out electronic circuitry (ROIC) substrate and a resistance element arranged at a distance of the surface of the ROIC substrate, wherein the resistance element comprises at least one silicon semiconducting layer and at least one semiconducting layer of a silicon-germanium alloy, a heterojunction being formed between the silicon semiconducting layer and the semiconducting layer of a silicon-germanium alloy.

2. The sensor according to claim 1, wherein the concentration of the components of the silicon-germanium alloy layer are graded in the thickness direction of the layer.

3. The sensor according to claim 2, wherein the concentration of Ge in the silicon-germanium alloy layer is graded from a predetermined value to zero over a range smaller than or equal to the thickness of the layer, the predetermined value in particular being equal to 40%.

4. The sensor according to claim 1, wherein the semiconductors layers of the resistance element form a structure that carries a mirror layer for reflecting the radiation, the mirror layer facing a cavity formed between the resistance element and the ROIC substrate.

5. The sensor according to claim 1, wherein the atomic concentration of Ge in a semiconducting layer of a silicon-germanium alloy, if such a layer is provided in the resistance element, is less than 40%.

6. The sensor according to claim 1, wherein at least one of the semiconducting layers, in particular a silicon-germanium alloy layer, comprise carbon, in particular in a concentration less than or equal to 1% (atomic).

7. The sensor according to claim 1, wherein a silicon semiconducting layer and/or a silicon-germanium alloy layer has an atomically abrupt dopant profile with about 10 to a few 100 nm layer thicknesses and a transition of several orders of o magnitude in concentration over a few nm, in particular $1 \cdot 10^{15}$ cm$^{-3}$ to $1 \cdot 10^{19}$ cm$^{-3}$ over 10 nm.

8. The sensor according to claim 1, wherein a silicon semiconducting layer and/or a silicon-germanium alloy layer comprises at least one interior layer region having a doping level that is significantly higher than that of the rest of the layer, the interior layer region in particular having a thickness in the range of 10-1000 nm and in particular a doping level in the range of a $1 \cdot 10^3$ cm$^5$ times the doping level in the rest of the layer and hi particular also a doping level above the limit for bandgap narrowing typically $1 \cdot 10^{17}$ cm$^{-3}$ to $1 \cdot 10^{20}$ cm$^{-3}$.

9. The sensor according to claim 1, wherein the semiconducting layer or layers is/are composed to make the resistance element have a bias dependent TCR.

10. The sensor according to claim 9, wherein the resistance element comprises a silicon-germanium layer embedded in between two silicon layers having significantly different thicknesses, the thicknesses in particular differing from one another by more than 10%.

11. The sensor according to claim 1, wherein the semiconducting layer or layers is/are composed to make the resistance element have a TCR of a zero value, at least at a predetermined temperature.

* * * * *